United States Patent
Lee et al.

(10) Patent No.: US 11,758,659 B2
(45) Date of Patent: Sep. 12, 2023

(54) FLEXIBLE PRINTED CIRCUIT BOARD, COF MODULE, AND ELECTRONIC DEVICE COMPRISING THE SAME

(71) Applicant: LG INNOTEK CO., LTD., Seoul (KR)

(72) Inventors: Eon Jong Lee, Seoul (KR); Dong Chan Kim, Seoul (KR); Ki Tae Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 47 days.

(21) Appl. No.: 17/504,611

(22) Filed: Oct. 19, 2021

(65) Prior Publication Data

US 2022/0132666 A1 Apr. 28, 2022

(30) Foreign Application Priority Data

Oct. 27, 2020 (KR) ........................ 10-2020-0140186

(51) Int. Cl.
*H05K 1/11* (2006.01)
*H05K 1/02* (2006.01)
*H05K 1/18* (2006.01)

(52) U.S. Cl.
CPC ............ *H05K 1/118* (2013.01); *H05K 1/028* (2013.01); *H05K 1/111* (2013.01); *H05K 1/189* (2013.01); *H05K 2201/10136* (2013.01)

(58) Field of Classification Search
CPC .. H05K 1/0201; H05K 1/0203; H05K 1/0207; H05K 1/0209; H05K 1/0277;
(Continued)

(56) References Cited

U.S. PATENT DOCUMENTS 5,925,445 A 7/1999 Suzuki
6,407,796 B2 6/2002 Tajima et al.
(Continued)

FOREIGN PATENT DOCUMENTS

| JP | H 02-42738 A | 2/1990 | |
|---|---|---|---|
| JP | 10214858 A * | 8/1998 | ......... H01L 23/5387 |
| JP | H 10-214858 A | 8/1998 | |
| KR | 10-0658362 B1 | 12/2006 | |
| KR | 10-2017-0086818 | 7/2017 | |

OTHER PUBLICATIONS

JP 10214858 A Translation (Year: 2023).*
Chinese Office Action dated Apr. 6, 2023 issued in Application 202111249527.4.

*Primary Examiner* — Hoa C Nguyen
*Assistant Examiner* — John B Freal
(74) *Attorney, Agent, or Firm* — KED & Associates LLP

(57) ABSTRACT

A flexible printed circuit board includes: a substrate; and a circuit pattern disposed on the substrate, wherein the substrate includes a chip mounting region, and the circuit pattern includes a wiring portion and a pad portion, wherein the circuit pattern includes: a first circuit pattern including a first-first pad portion disposed inside the chip mounting region, a first-second pad portion disposed outside the chip mounting region, and a first wiring portion that connects the first-first pad portion and the first-second pad portion, and extending in a first direction based on the chip mounting region; a second circuit pattern including a second-first pad portion disposed inside the chip mounting region, a second-second pad portion disposed outside the chip mounting region, and a second wiring portion that connects the second-first pad portion and the second-second pad portion, and extending in a second direction; and a third circuit pattern including a plurality of third pad portions disposed inside the chip mounting region and including a third wiring portion connecting the third pad portion and an extension wiring portion that extends to the outside of the third pad portion, (Continued)

and a protective layer is disposed on the first wiring portion and the second wiring portion.

20 Claims, 10 Drawing Sheets

(58) Field of Classification Search
CPC .... H05K 1/0278; H05K 1/028; H05K 1/0296; H05K 1/11; H05K 1/111; H05K 1/118; H05K 1/14; H05K 1/147; H05K 1/148; H05K 1/18; H05K 1/181; H05K 1/189; H05K 2201/10128; H05K 2201/10136
See application file for complete search history.

(56) References Cited

U.S. PATENT DOCUMENTS

| | | | |
|---|---|---|---|
| 9,961,762 B2 | 5/2018 | Shin et al. | |
| 2001/0040664 A1 | 11/2001 | Tajima et al. | |
| 2005/0012179 A1* | 2/2005 | Kang | |
| 2007/0034402 A1* | 2/2007 | Cheng | G02F 1/13452 |
| | | | 174/268 |
| 2009/0184418 A1* | 7/2009 | Hwang | H05K 1/0277 |
| | | | 257/737 |
| 2009/0231823 A1* | 9/2009 | Kunimatsu | H05K 1/111 |
| | | | 361/783 |
| 2015/0311148 A1* | 10/2015 | Jung | H01L 23/49838 |
| | | | 361/767 |

\* cited by examiner

FLEXIBLE PRINTED CIRCUIT BOARD, COF MODULE, AND ELECTRONIC DEVICE COMPRISING THE SAME

CROSS-REFERENCE TO RELATED APPLICATIONS

This application claims priority under 35 U.S.C. 119 and 35 U.S.C. 365 to Korean Patent Application No. 10-2020-0140186 (filed on 27 Oct. 2020), which is hereby incorporated by reference in its entirety.

TECHNICAL FIELD

An embodiment relates to a flexible printed circuit board, a COF module, and an electronic device including the same. In detail, the flexible printed circuit board may be a flexible printed circuit board for COF.

BACKGROUND ART

Recently, various electronic products are thin, miniaturized, and lightened. Accordingly, a research for mounting a semiconductor chip at a high density in a narrow region of an electronic device is being conducted in various ways.

Among them, since a chip on film (COF) method uses a flexible substrate, the COF method may be applied to both a flat panel display and a flexible display. That is, since the COF method may be applied to various wearable electronic devices, the COF method is attracting attention. In addition, since the COF method may realize a fine pitch, the COF method may be used to realize a high-resolution display (QHD as the number of pixel increases.

A chip on film (COF) is a method in which a semiconductor chip is mounted on a flexible printed circuit board in the form of a thin film. For example, the semiconductor chip may be an integrated circuit (IC) chip or a large scale integrated circuit (LSI) chip.

Meanwhile, chips mounted on the flexible printed circuit board may be disposed in a multiple-layer structure that performs respective roles.

Recently, a film level route (FLR) technology in which one of the chips having such a multiple-layer structure and a circuit pattern connected thereto are directly disposed on the flexible printed circuit board has been applied. That is, a layer structure of the chip may be reduced, thereby reducing manufacturing costs of the chip by disposing a routing pattern in a chip mounting region of the flexible printed circuit board.

Meanwhile, there is a problem that cracks occur in one region of the routing pattern due to tensile stress generated during a process of bonding the routing pattern and chip, and thus reliability of the COF module is deteriorated.

Therefore, a flexible printed circuit board, a COF module, and an electronic device including the same having a new structure that can solve the above problems are required.

SUMMARY

Technical Problem

An embodiment is directed to providing a flexible printed circuit board having improved reliability, a COF module, and an electronic device including the same.

Technical Solution

A flexible printed circuit board includes: a substrate; and a circuit pattern disposed on the substrate, wherein the substrate includes a chip mounting region, and the circuit pattern includes a wiring portion and a pad portion, wherein the circuit pattern includes: a first circuit pattern including a first-first pad portion disposed inside the chip mounting region, a first-second pad portion disposed outside the chip mounting region, and a first wiring portion that connects the first-first pad portion and the first-second pad portion, and extending in a first direction based on the chip mounting region; a second circuit pattern including a second-first pad portion disposed inside the chip mounting region, a second-second pad portion disposed outside the chip mounting region, and a second wiring portion that connects the second-first pad portion and the second-second pad portion, and extending in a second direction; and a third circuit pattern including a plurality of third pad portions disposed inside the chip mounting region and including a third wiring portion connecting the third pad portion and an extension wiring portion that extends to the outside of the third pad portion, and a protective layer is disposed on the first wiring portion and the second wiring portion.

Advantageous Effects

A flexible printed circuit board according to an embodiment may include a third circuit pattern. In detail, the flexible printed circuit board according to the embodiment may include the third circuit pattern that may serve to drive one of chips having a multiple-layer structure disposed in a chip mounting region of the flexible printed circuit board.

Accordingly, it is possible to simplify a manufacturing process of the chip having the multiple-layer structure.

In addition, the third circuit pattern of the flexible printed circuit board according to the embodiment may include a bent portion.

Accordingly, it is possible to prevent the third circuit pattern from being disconnected or cracked during a bonding process due to tensile stress generated when the third circuit pattern and the chip are bonded.

Accordingly, it is possible to improve the reliability of the flexible printed circuit board according to the embodiment and the COF module including the same.

In addition, the flexible printed circuit board according to the embodiment may further include a heat dissipation circuit pattern. In detail, it is possible to effectively dissipate heat generated during driving of the COF module by further disposing the heat dissipation circuit pattern connected to the chip.

DETAILED DESCRIPTION OF THE EMBODIMENTS

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a flexible printed circuit board, a COF module, and an electronic device including the same according to an embodiment will be described with reference to the drawings.

Figure 1:
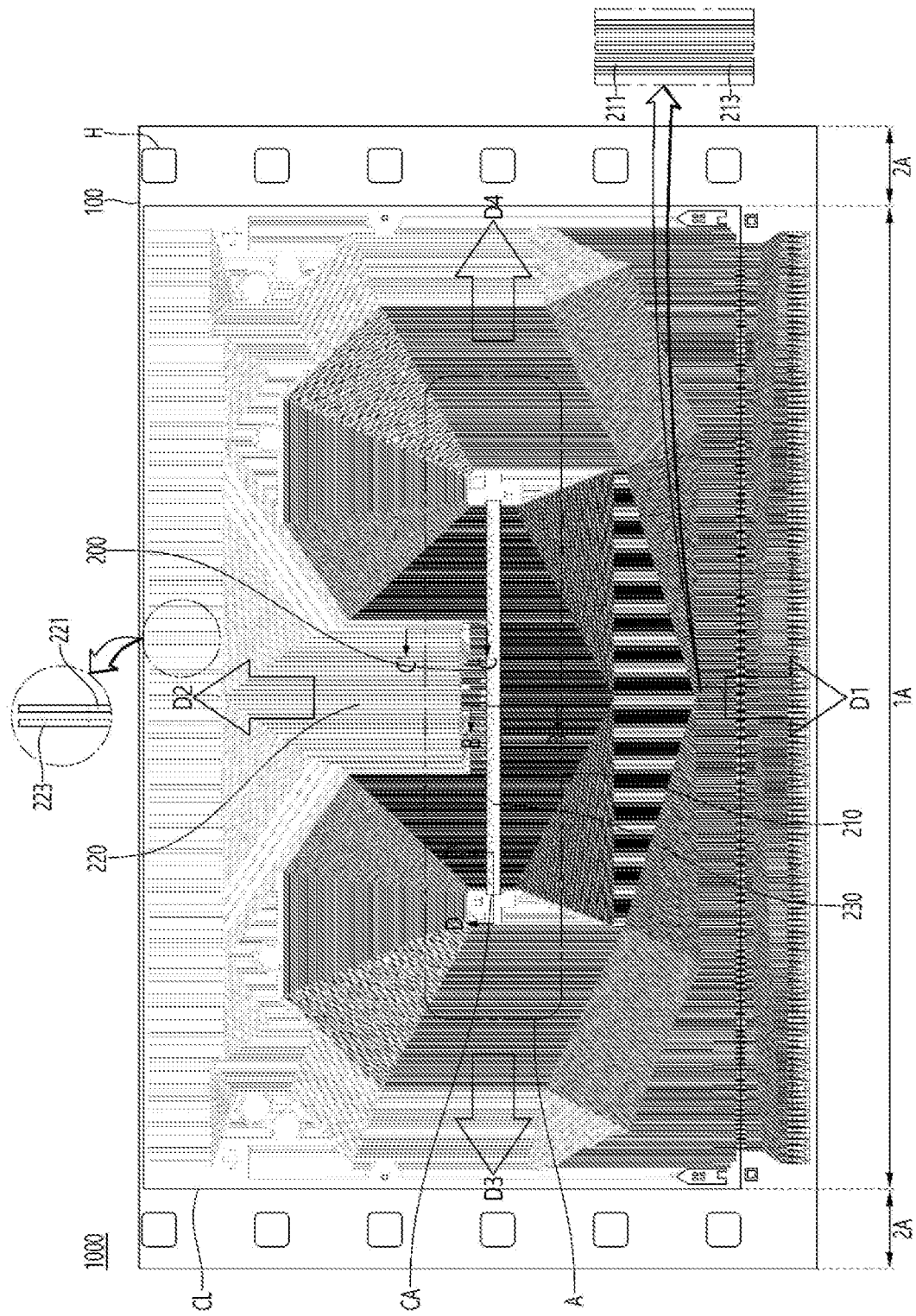
FIG. 1 is a top view of a flexible printed circuit board according to an embodiment.

FIG. 1 is a top view of a flexible printed circuit board according to an embodiment.

Referring to FIG. 1, a flexible printed circuit board 1000 according to the embodiment may include a substrate 100 and a circuit pattern 200 disposed on the substrate 100.

The substrate 100 may include a flexible substrate. For example, the substrate 100 may be a polyimide (PI) substrate. However, the embodiment is not limited thereto, and the substrate 100 may include a polymer material such as polyethylene terephthalate (PET), polyethylene naphthalate (PEN), or the like. Accordingly, the flexible printed circuit board including the substrate 100 may be used in various electronic devices having a curved display device. For example, the flexible printed circuit board including the substrate 100 is excellent in flexible characteristics, thereby having suitability of mounting a semiconductor chip on a wearable electronic device The substrate 100 may have a thickness of 20 µm to 100 µm. For example, the substrate 100 may have a thickness of 25 µm to 50 µm. For example, the substrate 100 may have a thickness of 30 µm to 40 µm. When the thickness of the substrate 100 exceeds 100 µm, the overall thickness of the flexible printed circuit board may be increased, and accordingly, the flexible characteristics may be deteriorated. In addition, when the thickness of the substrate 100 is less than 20 µm, the substrate 100 may be vulnerable to heat/pressure in a process of mounting a chip.

The substrate 100 may include a first region 1A and a second region 2A. For example, the first region 1A may be a central region of the substrate 100, and the second region 2A may be an outer region of the substrate 100. That is, the first region 1A may be disposed between the second regions 2A.

The first region 1A may include a chip mounting region CA. In detail, the first region 1A may include the chip mounting region CA in which a chip C connected to the circuit pattern is mounted.

In addition, circuit patterns 210, 220, and 230 may be disposed on the first region 1A. In detail, a plurality of circuit patterns that are spaced apart from each other and extend in multiple directions may be disposed in the first region 1A.

The circuit pattern may not be disposed in the second region 2A. That is, the first region 1A and the second region 2A may be divided according to the presence or absence of the arrangement of the circuit pattern.

The second region 2A may include a plurality of holes. In detail, the second region 2A may include a plurality of sprocket holes H. The flexible printed circuit board may be wound or unwound by the sprocket hole H in a roll-to-roll manner.

The flexible printed circuit board may be processed into the COF module and mounted on various electronic devices after cutting a boundary line CL between the second region 2A in which the sprocket hole H is formed and the first region 1A.

The circuit pattern may include a wiring portion and a pad portion. In addition, the plurality of circuit patterns may be disposed in the first region 1A. In detail, a first circuit pattern 210, a second circuit pattern 220, and a third circuit pattern 230 may be disposed in the first region 1A.

Figure 2:
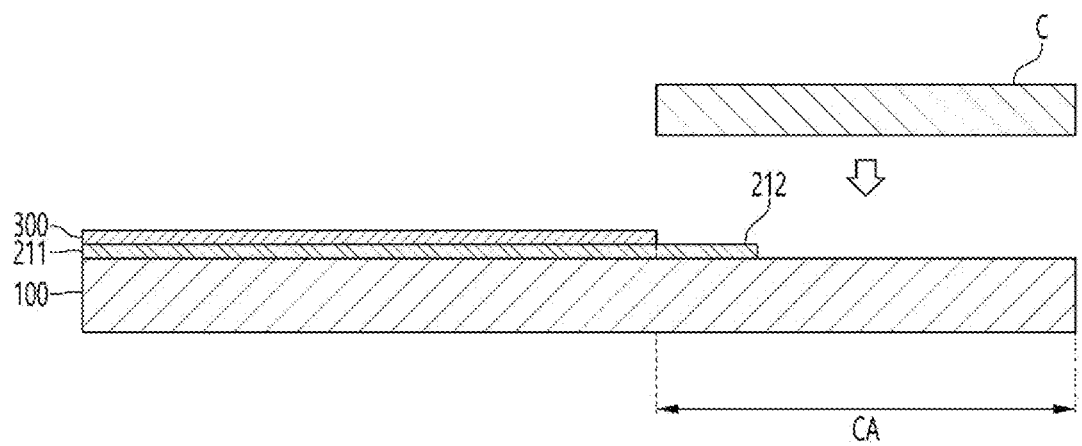
FIG. 2 is a cross-sectional view taken along line B-B' in FIG. 1.

Referring to FIGS. 1 and 2, the first circuit pattern 210 may include a first wiring portion 211, a first-first pad portion 212, and a first-second pad portion 213. In detail, the first circuit pattern 210 may include the first-first pad portion 212 disposed inside the chip mounting region CA, the first-second pad portion 213 disposed outside the chip mounting region CA, and the first wiring portion 211 disposed between the first-first pad portion 212 and the first-second pad portion 213 and connected to the first-first pad portion 212 and the first-second pad portion 213.

The first wiring portion 211, the first-first pad portion 212, and the first-second pad portion 213 may be integrally formed.

In addition, the first wiring portion 211 may be disposed to extend in a first direction D1 based on the chip mounting region CA.

The first-first pad portion 212 may be electrically connected to a chip disposed in the chip mounting region. In addition, the first-second pad portion 213 may be electrically connected to a display panel. In addition, the first wiring portion 211 may transmit a signal between the chip and the display panel.

A protective layer 300 may be disposed on the first circuit pattern 210. In detail, the protective layer 300 may be disposed on the first wiring portion 211. The protective layer 300 may be disposed to surround the first wiring portion 211. In addition, the protective layer 300 may not be disposed on the first-first pad portion 212 and the first-second pad portion 213.

Figure 3:
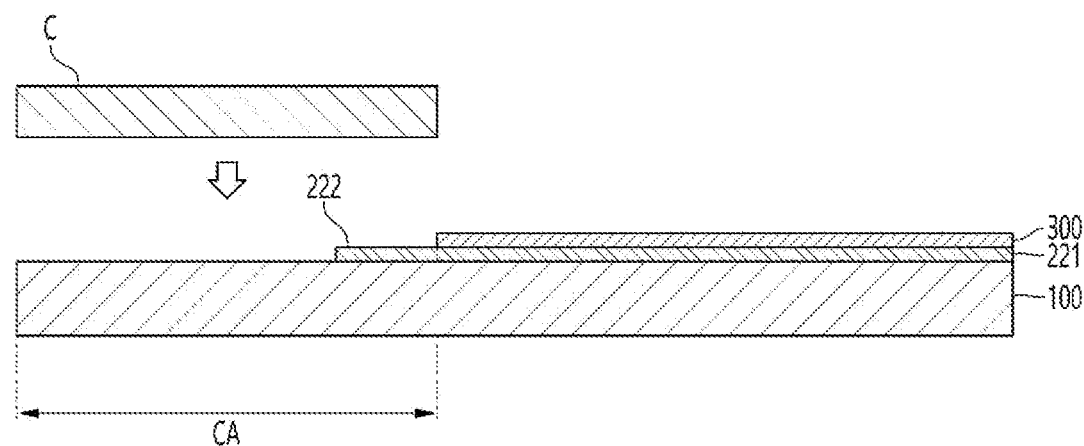
FIG. 3 is a cross-sectional view taken along line C-C' in FIG. 1.

In addition, referring to FIGS. 1 and 3, the second circuit pattern 220 may include a second wiring portion 221, a second-first pad portion 222, and a second-second pad portion 223. In detail, the second circuit pattern 220 may include the second-first pad portion 222 disposed inside the chip mounting region CA, the second-second pad portion 223 disposed outside the chip mounting region CA, and the second wiring portion 221 disposed between the second-first pad portion 222 and the second-second pad portion 223 and connected to the second-first pad portion 222 and the second-second pad portion 223.

The second wiring portion 221, the second-first pad portion 222, and the second-second pad portion 223 may be integrally formed.

In addition, the second wiring portion 221 may be disposed to extend in a second direction D2 based on the chip mounting region CA. In detail, the second wiring portion 221 may be disposed to extend in the second direction D2 opposite to the first direction D1.

The second-first pad portion 222 may be electrically connected to the chip disposed in the chip mounting region. In addition, the second-second pad portion 223 may be electrically connected to a printed circuit board. In addition, the second wiring portion 211 may transmit a signal between the chip and the printed circuit board.

The protective layer 300 may be disposed on the second circuit pattern 220. In detail, the protective layer 300 may be disposed on the second wiring portion 221. The protective layer 300 may be disposed to surround the second wiring portion 221. In addition, the protective layer 300 may not be disposed on the second-first pad portion 222 and the second-second pad portion 223.

Figure 4:
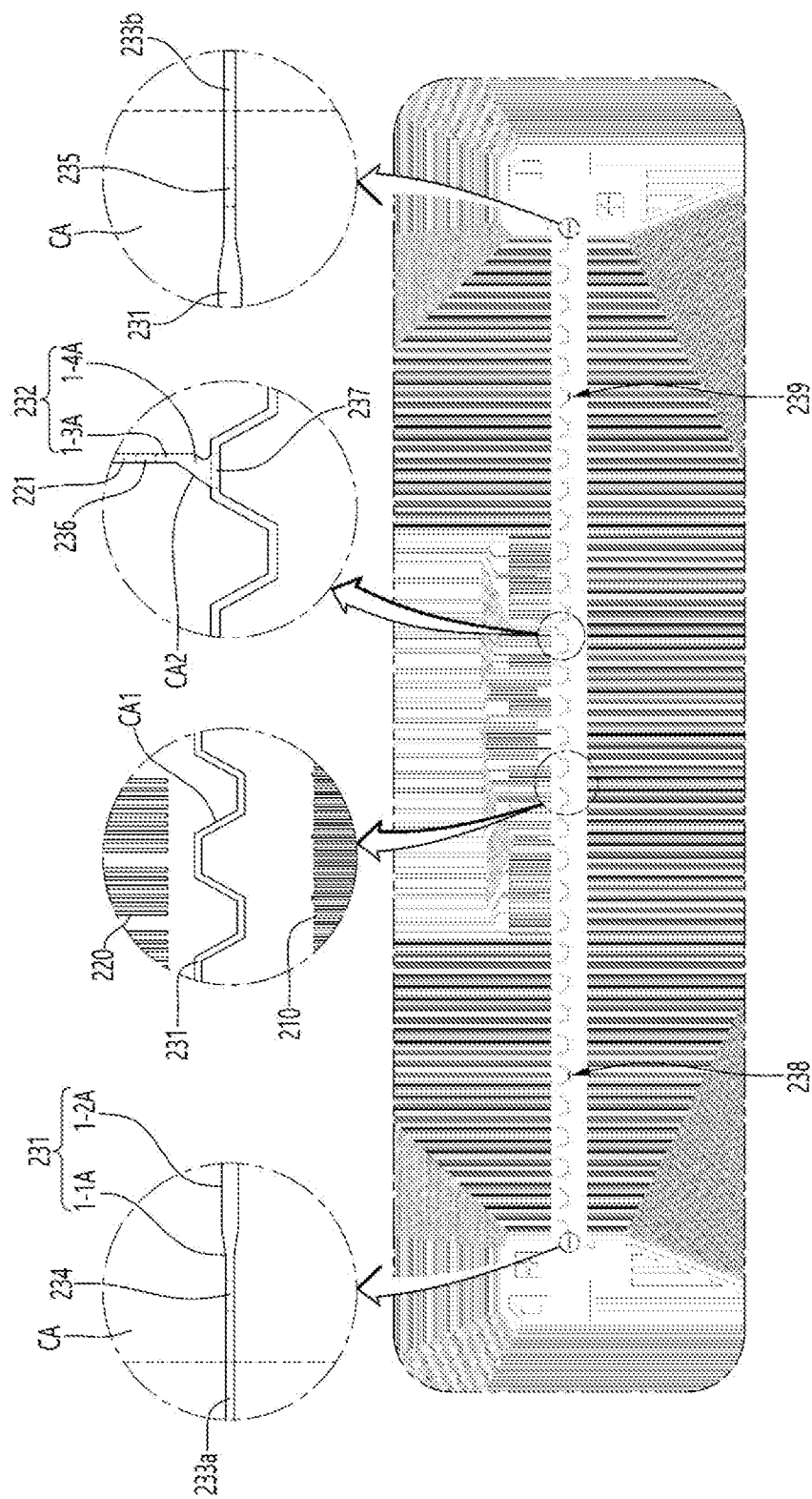
FIG. 4 is an enlarged view of region A in FIG. 1.

Referring to FIG. 1 and FIG. 4, the third circuit pattern 230 may include a third wiring portion and a plurality of pad portions. In detail, the third circuit pattern 230 may include the third wiring portion and the plurality of pad portions disposed inside the chip mounting region CA. In addition, the third circuit pattern 230 may further include extension wiring portions 233a and 233b. In detail, the third circuit pattern 230 may include the extension wiring portions 233a and 233b extending outside the third pad portion. That is, the third circuit pattern 230 may include the extension wiring portions 233a and 233b disposed outside the chip mounting region CA.

The third circuit pattern 230 may be connected to the chip C disposed in the chip mounting region CA. In detail, the plurality of pad portions of the third circuit pattern 230 may be electrically connected to the chip C. In detail, the third circuit pattern 230 may include a plurality of third circuit patterns 230, and each of the third circuit patterns 230 may have a plurality of pad portions, and the plurality of pad portions of each of the third circuit patterns may be electrically connected to the chip C.

The third circuit pattern 230 may be a routing pattern. That is, the third circuit pattern 230 may be a routing pattern serving as one of layers of a chip having a plurality of layers disposed in the chip mounting region CA.

As the third circuit pattern 230 is connected to the chip CA via the plurality of pad portions, the third circuit pattern 230 may receive an electronic signal transmitted from the first circuit pattern 210 to process the electronic signal, and the electronic signal transmitted from the third circuit pattern 230 through the chip C and the second circuit pattern 220 may be transmitted to the display panel.

The first circuit pattern 210, the second circuit pattern 220, and the third circuit pattern 230 may include a metal material having excellent electrical conductivity. In detail, the first circuit pattern 210, the second circuit pattern 220, and the third circuit pattern 230 may include copper (Cu). However, the embodiment is not limited thereto, and the first circuit pattern 210, the second circuit pattern 220, and the third circuit pattern 230 may include at least one metal among copper (Cu), aluminum (Al), and chromium (Cr), nickel (Ni), silver (Ag), molybdenum (Mo), gold (Au), titanium (Ti), and an alloy thereof.

The first circuit pattern 210, the second circuit pattern 220, and the third circuit pattern 230 may be formed in multiple layers. In detail, the first circuit pattern 210, the second circuit pattern 220, and the third circuit pattern 230 may include a first metal layer and a second metal layer.

The first metal layer may be a seed layer of the first circuit pattern 210 and the second circuit pattern 220. The first metal layer may be formed in a single layer or in multiple layers. The first metal layer may include copper. The first metal layer may be formed through electroless plating or sputtering after disposing a buffer layer described below on the substrate 100.

In addition, the second metal layer may be a plating layer. In detail, the second metal layer may be a plating layer formed by electroplating using the first metal layer as a seed layer.

A thickness of the first metal layer may be smaller than a thickness of the second metal layer.

For example, the thickness of the first metal layer may be 0.7 μm to 2 μm, and the thickness of the second metal layer may be 10 μm to 25 μm.

The first metal layer and the second metal layer may include the same metal material. For example, the first metal layer and the second metal layer may include copper (Cu).

A plating layer may be further disposed on the second metal layer. The plating layer may serve as an adhesive layer capable of electrically adhering to the chip C. In detail, the plating layer may include tin (Sn).

The plating layer may be formed on the entire wiring portion and pad portion of the circuit patterns. In addition, the plating layer may be formed in one layer or two layers.

The plating layer needs to be a pure plating layer in order to serve as an adhesion to the chip C. To this end, a thickness of the plating layer on the pad portion may be formed to be 0.1 μm or more, 0.2 μm or more, 0.3 μm or more, 0.4 μm or more, 0.5 μm or more, or 10 μm or less.

When the thickness of the plating layer on the pad portion is less than 0.1 μm, when the plating layer is formed, the second metal layer of the circuit pattern, that is, copper is diffused into the plating layer, and a pure tin plating layer may not be formed, and thus an adhesive force with the chip C may be reduced.

In addition, when the thickness of the plating layer exceeds 10 μm, a thickness of the flexible circuit board may be increased.

Accordingly, the plating layer may be formed in one layer with a thickness of 0.1 μm or more, 0.2 μm or more, 0.3 μm or more, 0.4 μm or more, 0.5 μm or more, or 10 μm or less on upper and side surfaces of the circuit pattern, or 0.1 μm or less on the wiring portion of the circuit pattern and may be formed in two layers with a thickness of 0.1 μm or more, 0.2 μm or more, 0.3 μm or more, 0.4 μm or more, 0.5 μm or more, or 10 μm or less. In detail, the wiring portion of the circuit pattern may be formed thin to prevent cracks due to the plating layer when the flexible circuit board is bent, and the pad portion may be formed thick to facilitate contact with the chip C.

The first circuit pattern 210, the second circuit pattern 220, and the third circuit pattern 230 may be disposed to have a thickness of 2 μm to 25 μm. For example, the first circuit pattern 210, the second circuit pattern 220, and the third circuit pattern 230 may be disposed to have a thickness of 5 μm to 20 μm. For example, the first circuit pattern 210, the second circuit pattern 220, and the third circuit pattern 230 may be disposed to have a thickness of 7 μm to 15 μm.

Since the first circuit pattern 210, the second circuit pattern 220, and the third circuit pattern 230 is subjected to a process of etching the first metal layer by flash etching performed for separation of the circuit patterns during a manufacturing process, the first circuit pattern 210, the second circuit pattern 220, and the third circuit pattern 230 to be finally manufactured may be smaller than the sum of the thicknesses of the first metal layer, the second metal layer, and the plating layer.

When the thickness of the first circuit pattern 210, the second circuit pattern 220, and the third circuit pattern 230 is less than 2 μm, resistances of the first circuit pattern 210, the second circuit pattern 220, and the third circuit pattern 230 may increase. When the thickness of the first circuit pattern 210, the second circuit pattern 220, and the third circuit pattern 230 exceeds 25 μm, it may be difficult to implement a fine pattern.

Meanwhile, a buffer layer may be further disposed between the substrate 100 and the first circuit pattern 210, the second circuit pattern 220, and the third circuit pattern 230. The buffer layer may improve adhesion between the substrate 100 and the first circuit pattern 210, the second circuit pattern 220, and the third circuit pattern 230 that are a dissimilar material.

The buffer layer may be formed in multiple layers. In detail, a first buffer layer and a second buffer layer on the first buffer layer may be disposed on the substrate 100. Accordingly, the first buffer layer may be in contact with the substrate 100, and the second buffer layer may be disposed in contact with the first circuit pattern 210, the second circuit pattern 220, and the third circuit pattern 230.

The first buffer layer may include a material having good adhesion to the substrate 100. For example, the first buffer layer may include nickel (Ni). In addition, the second buffer layer may include a material having good adhesion to the circuit pattern 200. For example, the second buffer layer may include chromium (Cr).

The buffer layer including the first buffer layer and the second buffer layer may have a thin film thickness of nanometers. For example, the buffer layer may have a thickness of 20 nm or less.

Since the adhesion between the substrate 100 and the first circuit pattern 210 and the second circuit pattern 220 that are a dissimilar material may be improved by the buffer layer, it is possible to prevent delamination of a film of the first circuit pattern 210 and the second circuit pattern 220.

Meanwhile, the protective layer 300 may be disposed on the wiring portion of the first circuit pattern 210, the second circuit pattern 220, and the third circuit pattern 230. In detail, the protective layer 300 may be disposed to surround the first wiring portion 211, the second wiring portion 221, and the third wiring portion 231. That is, the protective layer 300 may be disposed on the first circuit pattern 210, the second circuit pattern 220, and the third circuit pattern 230 excluding the first-first pad portion, the first-second pad portion, the second-first pad portion, the second-second pad portion, and the third pad portion.

The protective layer 300 may include solder paste. For example, the protective layer 300 may include a solder paste including a thermosetting resin, a thermoplastic resin, a filler, a curing agent, or a curing accelerator.

FIG. 4 is an enlarged view of region A in FIG. 1. That is, FIG. 4 is an enlarged view of the chip mounting region of the flexible printed circuit board.

Referring to FIG. 4, the third circuit pattern 230 may be disposed in the chip mounting region CA. The third circuit pattern 230 may be disposed to extend in a plurality of directions. In detail, the third circuit pattern 230 may be disposed to extend in a direction corresponding to a longitudinal direction and a direction corresponding to a width direction of the chip mounting region CA.

In FIG. 4, one third circuit pattern 230 is disposed in the chip mounting region CA, but it is only an embodiment, and a plurality of third circuit patterns 230 extending in one direction or a plurality of directions and spaced apart from each other may be disposed in the chip mounting region CA.

For example, the plurality of third circuit patterns 230 spaced apart from each other may be disposed in the chip mounting region CA. Accordingly, the number of layer structures of the chip disposed in the chip mounting region CA may be reduced, thereby reducing a chip manufacturing process.

The third circuit pattern 230 may include third wiring portions 231 and 232 and a plurality of third pad portions connected to the third wiring portions 231 and 232. The third wiring portion may be a moving passage region for the electronic signal, and the third pad portion may be a region connected to the chip. The third pad portion may be integrally formed with the third wiring portion, The third circuit pattern 230 may include a plurality of third wiring portions. In detail, the third circuit pattern 230 may include the plurality of third wiring portions extending in different directions. For example, the third circuit pattern 230 may include a third-first wiring portion 231 and a third-second wiring portion 232 extending in different directions.

For example, the third-second wiring portion 232 may be disposed to extend in a direction the same as or similar to those of the first direction D1 and the second direction D2. In addition, the third-first wiring portion 231 may be disposed to extend in a third direction D3 and a fourth direction D4 that are different from the first direction D1 and the second direction D2. For example, the third-first wiring portion 231 may be disposed to extend in the third direction D3 and the fourth direction D4 that are perpendicular to the first direction D1 and the second direction D2.

Through this, the third circuit pattern may perform a role of one layer of the multiple-layer structure of the chip disposed in the chip mounting region CA, and a terminal of the chip connected to the third circuit pattern may be formed in the third direction and/or the fourth direction that are different directions from a terminal of the chip connected to the first circuit pattern and the second circuit pattern, so that more chip functions may be implemented on the flexible circuit board in a limited space, and a test for confirming signal transmission characteristics through the third circuit pattern may also be efficiently performed in a region other than a test region of the first circuit pattern and the second circuit pattern.

The third-second wiring portion 232 may be integrally formed with the second circuit pattern 220. In detail, the third-second wiring portion 232 may be integrally formed with the second wiring portion 221 or the second-first pad portion 222 of the second circuit pattern 220.

The third-first wiring portion 231 and the third-second wiring portion 232 may be connected to each other. In detail, the third-first wiring portion 231 and the third-second wiring portion 232 may be integrally formed.

In addition, the third circuit pattern 230 may include the plurality of third pad portions. For example, the third circuit pattern 230 may include two third pad portions. In detail, the third circuit pattern 230 may include a third-first pad portion 234 and a third-second pad portion 235. In detail, the third circuit pattern 230 may be formed in plural, and each of the third circuit patterns 230 may include two or two or more third pad portions.

The third-first pad portion 234 and the third-second pad portion 235 may be connected to the third-first wiring portion 231. That is, the third-first wiring portion 231 may be disposed between the third-first pad portion 234 and the third-second pad portion 235 and connected to the third-first pad portion 234 and the third-second pad portion 235. The third-first pad portion 234 and the third-second pad portion 235 may be disposed to face each other in the third direction D3 or the fourth direction D4.

Through this, the terminal of the chip connected to the third circuit pattern 230 may be formed in the third direction and/or the fourth direction that are different directions from the terminal of the chip connected to the first circuit pattern and the second circuit pattern, so that more chip functions may be implemented on the flexible circuit board in a limited space.

Alternatively, the third circuit pattern 230 may further include a third-third pad portion 236. In detail, the third circuit pattern 230 may further include the third-third pad portion 236 connected to the third-second wiring portion 232.

Alternatively, the third circuit pattern 230 may further include a third-fourth pad portion 237. In detail, the third circuit pattern 230 may further include the third-fourth pad portion 237 disposed in an intersecting region of the third-first wiring portion 231 and the third-second wiring portion 232.

Alternatively, the third circuit pattern 230 may further include a third-fifth pad portion 238. In detail, the third circuit pattern 230 may further include the third-fifth pad portion 238 between the third-first pad portion 234 and the third-fourth pad portion 237.

Alternatively, the third circuit pattern 230 may further include a third-sixth pad portion 239. In detail, the third circuit pattern 230 may further include the third-sixth pad portion 239 between the third-second pad portion 235 and the third-fourth pad portion 237.

Alternatively, although not shown in the drawings, the third circuit pattern 230 may include seven or more pad portions. In detail, the third circuit pattern 230 may further include an additional pad portion between the third-first pad portion 234 and the third-fourth pad portion 237 or between the third-second pad portion 235 and the third-fourth pad portion 237.

The third-first pad portion 234, the third-second pad portion 235, the third-third pad portion 236, the third-fourth pad portion 237, the third-fifth pad portion 238, and the third-sixth pad portion 239 may be connected to the chip C disposed in the chip mounting region CA. In detail, the third-first pad portion 234, the third-second pad portion 235, the third-third pad portion 236, the third-fourth pad portion 237, the third-fifth pad portion 238, and the third-sixth pad portion 239 may be connected to the terminal of the chip C disposed in the chip mounting region CA, whereby the third circuit pattern 230 may be electrically connected to the chip C.

The third-first wiring portion 231 may include a first-first region 1-1 A and a first-second region 1-2 A. In detail, the third-first wiring portion 231 may include the first-first region 1-1 A adjacent to the third-first pad portion 234 and the first-second region 1-2 A between the third-first pad portion 234 and the third-second pad portions 235.

A width of the first-first region 1-1 A and a width of the first-second region 1-2 A may be different from each other. In detail, the width of the first-first region 1-1 A may be smaller than the width of the first-second region 1-2 A. That is, the width of the first-second region 1-2 A between the third pad portions in which the third pad portion is not disposed may be greater than the width of the first-first region 1-1 A in which the third pad portion is disposed.

That is, a width of the third-first wiring portion between the third pad portions may be greater than a width of the third-first wiring portion of a third pad portion region.

In addition, the third-second wiring portion 232 may include a first-third region 1-3 A and a first-fourth region 1-4 A. In detail, the third-second wiring portion 232 may include the first-third region 1-3 A adjacent to the third-third pad portion 236 and the first-fourth region 1-4 A between the third-third pad portion 236 and the third-fourth pad portion 237.

Widths of the first-third region 1-3 A and the first-fourth region 1-4 A may be different from each other. In detail, the width of the first-third region 1-3 A may be smaller than the width of the first-fourth region 1-4 A. That is, the width of the first-fourth region 1-4 A between the third pad portions in which the third pad portion is not disposed may be greater than the width of the first-third region 1-3 A in which the third pad portion is disposed.

That is, a width of the third-second wiring portion between the third pad portions may be greater than a width of the third-second wiring portion in the third pad portion region.

By reducing a width of the third pad portion connected to the chip, more pad portions may be formed per unit area, and if necessary, a fourth circuit pattern may be further formed in the third direction of the chip mounting region and/or the fourth direction of the chip mounting region. In addition, since the third pad portion may be formed to have a width the same as or similar to that of the first pad portion and the second pad portion connected to the chip, design efficiency may be obtained when manufacturing the chip. In addition, by increasing the width of the third wiring portion, cracks that may occur in the third wiring portion having a relatively long length compared to a length of the third pad portion may be prevented.

Figure 5:
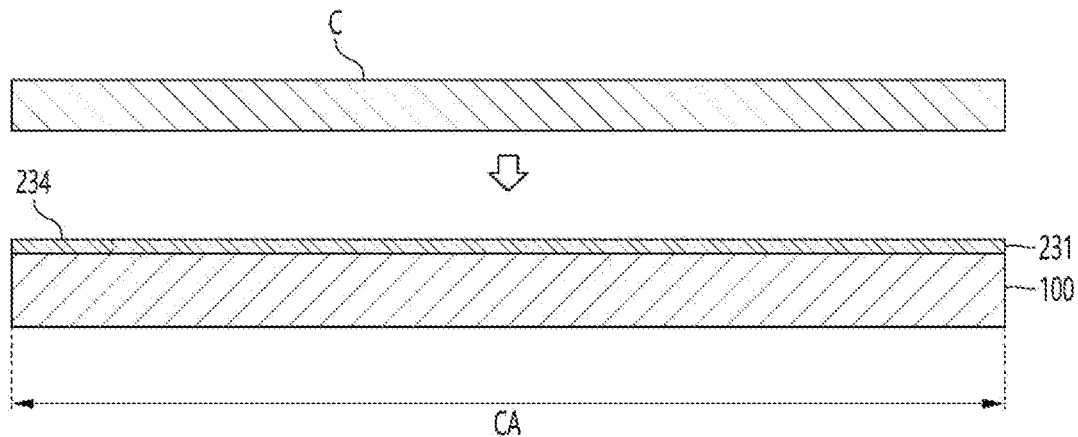
FIG. 5 is a cross-sectional view taken along line D-D' in FIG. 1.

Referring to FIG. 5, the plurality of third pad portions including the third-first pad portion 234 may be included on the third circuit pattern 230, and the third circuit pattern 230 may be connected to the chip C via the third pad portion.

In this case, high-temperature heat may be generated in a process of bonding the third circuit pattern 230 and the chip C of the chip mounting region CA, and tensile stress may be generated in the third circuit pattern 230 due to the high-temperature heat. Accordingly, cracks or disconnection may occur in at least one region of the third circuit pattern 230 during the process of bonding the third circuit pattern 230 and the chip C.

To solve this problem, the third circuit pattern 230 may include a bent portion. In detail, the third-first wiring portion 231 and the third-second wiring portion 232 of the third circuit pattern 230 may include at least one bent portion.

In detail, the third-first wiring portion 231 may include at least one first bent portion CA1 that extends in the third direction or the fourth direction and is bent in a direction different from the third direction or the fourth direction. In addition, the third-second wiring portion 232 may include at least one second bent portion CA2 that extends in the first direction or the second direction and is bent in a direction different from the first direction or the second direction.

The first bent portion CA1 and the second bent portion CA2 may improve reliability of the third circuit pattern 230. That is, by disposing the first bent portion and the second bent portion on the third circuit pattern 230, it is possible to minimize cracks or disconnections of the third circuit pattern 230 due to tensile stress generated during the process of bonding the third circuit pattern 230 and the chip C.

FIGS. 6 to 9 are views for describing an example of various shapes and arrangements of the third circuit pattern.

Figure 6:
FIGS. 6 to 9 are views showing various shapes of a third circuit pattern of the flexible printed circuit board according to the embodiment.
Figure 7:
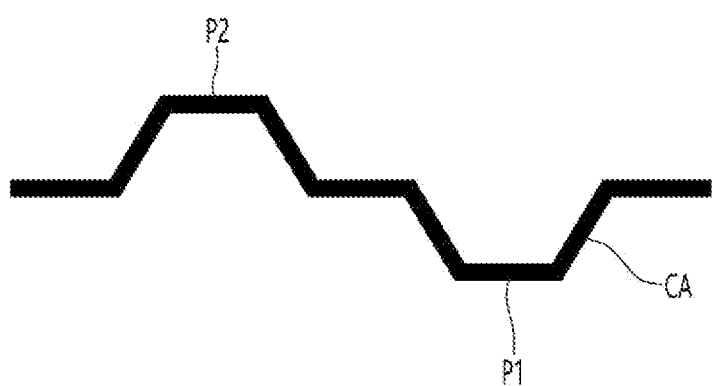

Referring to FIGS. 6 and 7, the third circuit pattern 230 may include a bent portion CA and may extend. In detail, the third circuit pattern 230 may include a plurality of bent portions CA bent in a direction different from a longitudinal direction of the third circuit pattern 230.

As shown in FIG. 6, the third circuit pattern 230 may include a concave portion pattern P1 concave in one direction by the bent portion CA and may extend. Accordingly, when tensile stress is generated in the third circuit pattern 230, the occurrence of cracks in one region of the third circuit pattern 230 may be minimized due to the concave portion pattern.

Alternatively, as shown in FIG. 7, the third circuit pattern 230 may include the concave portion pattern P1 concave in one direction and a convex portion pattern P2 convex in the other direction by the bent portion CA and may extend. Accordingly, when the tensile stress is generated in the third circuit pattern 230, the occurrence of cracks in one region of the third circuit pattern 230 may be minimized due to the concave portion pattern and the convex portion pattern.

In addition, since the third circuit pattern 230 has both the concave portion pattern and the convex portion pattern formed by the bent portion CA and extends, even when the tensile stress is generated in a direction different from the longitudinal direction of the third circuit pattern, the occurrence of cracks in one region of the third circuit pattern 230 may be minimized.

Figure 8:
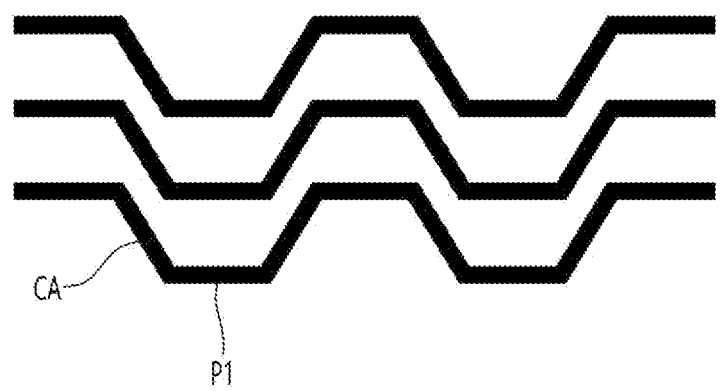
Figure 9:
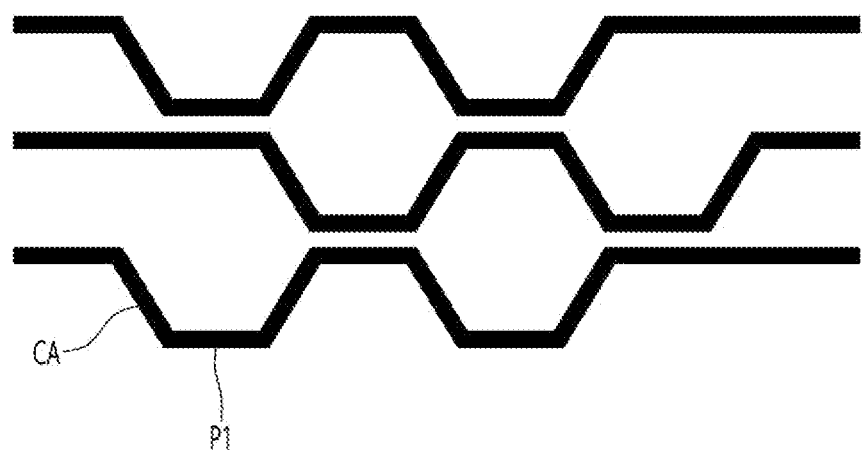

Referring to FIGS. 8 and 9, the third circuit patterns 230 may be disposed in plural, and each of the plurality of third circuit patterns 230 may include the bent portion CA and may extend. In detail, the plurality of third circuit patterns 230 may include the plurality of bending portions CA that are bent in a direction different from the longitudinal direction of the third circuit pattern 230.

As shown in FIG. 8, the plurality of third circuit patterns 230 may include a concave pattern concave in one direction by the bent portion CA and may extend. In addition, the plurality of third circuit patterns 230 may be disposed such that the concave portion patterns P1 overlap each other.

Accordingly, when tensile stress is generated in the third circuit pattern 230, the occurrence of cracks in one region of the third circuit pattern 230 may be minimized due to the concave portion pattern.

Alternatively, as shown in FIG. 9, the plurality of third circuit patterns 230 may be disposed such that the concave portion patterns P1 overlap each other. Accordingly, when the tensile stress is generated in the third circuit pattern 230, the occurrence of cracks in one region of the third circuit pattern 230 may be minimized due to the concave portion pattern and the convex portion pattern.

Meanwhile, as an example of the plurality of pad portions described above, at least one third pad portion among the third-first pad portion 234, the third-second pad portion 235, the third-third pad portion 236, the third-fourth pad portion 237, the third-fifth pad portion 238, and the third-sixth pad portion 239 may be disposed in a bent portion of the third circuit pattern 230.

Accordingly, the tensile stress generated in the third circuit pattern 230 may be evenly distributed in a bent portion region and a non-bent portion region in the third circuit pattern to prevent the stress from concentrating in one region of the third circuit pattern 230.

Meanwhile, the third circuit pattern 230 may further include an extension wiring portion. The extension wiring portion may be connected to at least one pad portion of the third pad portions.

The extension wiring portion may include a first extension wiring portion 233a and a second extension wiring portion 233b. In detail, the extension wiring portion 233 may include the first extension wiring portion 233a that is connected to the third-first pad portion 234 to extend and the second extension wiring portions 233b that is connected to the third-second pad portion 235 to extend.

For example, the first extension wiring portion 233a may be integrally formed with the third-first pad portion 234, and the second extension wiring portion 233b may be integrally formed with the third-second pad portion 235. One side of the first extension wiring portion 233a may be connected to the third-first pad portion 234, and the other end of the first extension wiring portion 233a may be short-circuited. That is, the other side of the first extension wiring portion 233a may not be connected to another wiring portion or pad portion while extending toward the outside of the chip mounting region CA.

Accordingly, the other side of the first extension wiring portion 233a may be disposed while being surrounded by the protective layer 300.

By preventing the first extension wiring portion from being exposed to the outside of the protective layer, it is possible to prevent defects due to cracks occurring in the first extension wiring portion during a process of mounting the chip in advance.

In addition, one side of the second extension wiring portion 233b may be connected to the third-second pad portion 235, and the other side of the second extension wiring portion 233b may be short-circuited. That is, the other side of the second extension wiring portion 233b may not be connected to another wiring portion or pad portion while extending toward the outside of the chip mounting region CA.

Accordingly, the other side of the second extension wiring portion 233b may be disposed while being surrounded by the protective layer 300.

The first extension wiring portion 233a and the second extension wiring portion 233b may serve as a test terminal of the third circuit pattern 230. In detail, the first extension wiring portion 233a and the second extension wiring portion 233b may serve as a test terminal that may check signal transmission characteristics through the third circuit pattern 230 before disposing the chip C in the chip mounting region CA.

Figure 10:
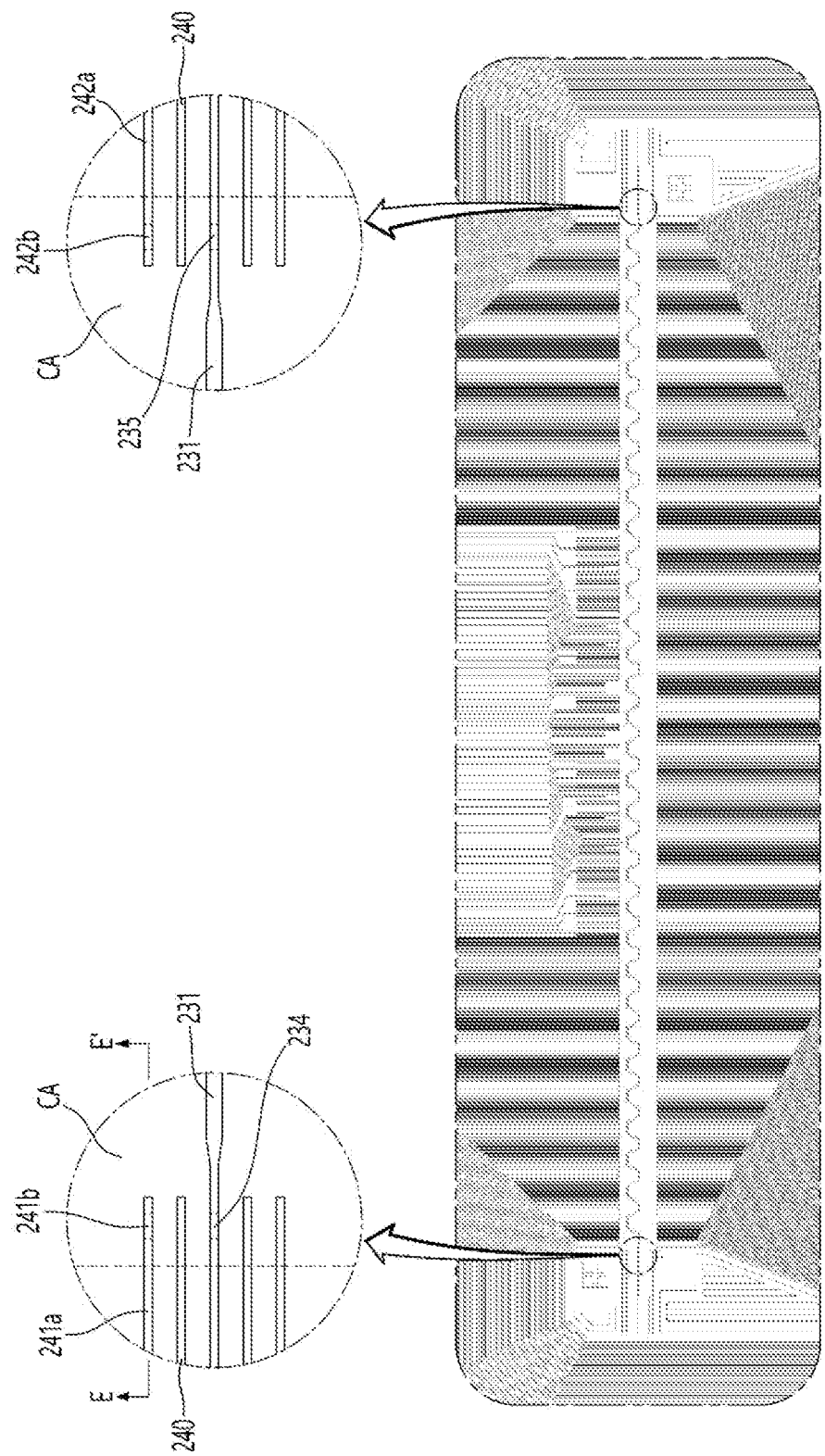
FIG. 10 is another enlarged view of region A in FIG. 1.
Figure 11:
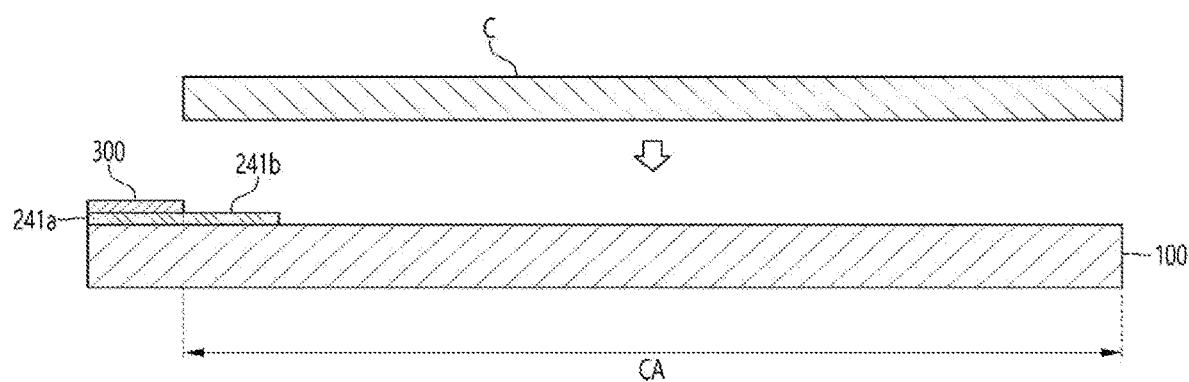
FIG. 11 is a cross-sectional view taken along line E-E' in FIG. 10.

Meanwhile, referring to FIGS. 10 and 11, the flexible printed circuit board according to the embodiment may further include a fourth circuit pattern 240.

The fourth circuit pattern 240 may include a fourth wiring portion and a fourth pad portion. In detail, the fourth circuit pattern 240 may include the fourth pad portion disposed inside the chip mounting region CA and the fourth wiring portion extending outside the fourth pad portion and disposed outside the chip mounting region CA.

The fourth wiring portion may include a fourth-first wiring portion 241a and a fourth-second wiring portion 242a. In addition, the fourth pad portion may include a fourth-first pad portion 241b connected to the fourth-first wiring portion 241a and a fourth-second pad portion 242b connected to the fourth-second wiring portion 242a.

One side of the fourth-first wiring portion 241a may be connected to the fourth-first pad portion 241b, and the other side of the fourth-first wiring portion 241a may be short-circuited. That is, the other side of the fourth-first wiring portion 241a may not be connected to another wiring portion or pad portion while extending toward the outside of the chip mounting region CA.

Accordingly, the other side of the fourth-first wiring portion 241a may be disposed while being surrounded by the protective layer 300.

In addition, one side of the fourth-second wiring portion 242a may be connected to the fourth-second pad portion 242b, and the other side of the fourth-second wiring portion 242a may be short-circuited. That is, the other side of the fourth-second wiring portion 242a may not be connected to another wiring portion or pad portion while extending toward the outside of the chip mounting region CA.

Accordingly, the other side of the fourth-second wiring portion 242a may be disposed being surrounded by the protective layer 300.

The fourth circuit pattern 240 may be electrically connected to the chip C disposed in the chip mounting region CA through the fourth-first pad portion and the fourth-second pad portion.

The fourth circuit pattern 240 may include a plurality of fourth circuit patterns spaced apart from each other. For example, the fourth circuit pattern 240 may include the plurality of fourth circuit patterns connected to the chip of the chip mounting region CA and spaced apart from each other.

Accordingly, the fourth circuit pattern 240 may be connected to the chip C to serve to dissipate heat generated during driving of the chip C. That is, the fourth circuit pattern 240 may be a heat dissipation circuit pattern connected to the chip.

Accordingly, the flexible printed circuit board according to the embodiment may effectively dissipate heat through the fourth circuit pattern 240, thereby improving the reliability of the flexible printed circuit board.

The flexible printed circuit board according to the embodiment may include a third circuit pattern. In detail, the flexible printed circuit board according to the embodiment may include the third circuit pattern that may serve to drive one of the chips having the multiple-layer structure disposed in the chip mounting region of the flexible printed circuit board.

Accordingly, it is possible to simplify a manufacturing process of the chip having the multiple-layer structure.

In addition, the third circuit pattern of the flexible printed circuit board according to the embodiment may include a bent portion.

Accordingly, it is possible to prevent the third circuit pattern from being disconnected or from being cracked during a bonding process due to tensile stress generated when the third circuit pattern and the chip are bonded.

Accordingly, it is possible to improve the reliability of the flexible printed circuit board according to the embodiment and the COF module including the same.

In addition, the flexible printed circuit board according to the embodiment may further include a heat dissipation circuit pattern. In detail, it is possible to effectively dissipate the heat generated during driving of the COF module by further disposing the heat dissipation circuit pattern connected to the chip.

Figure 12:
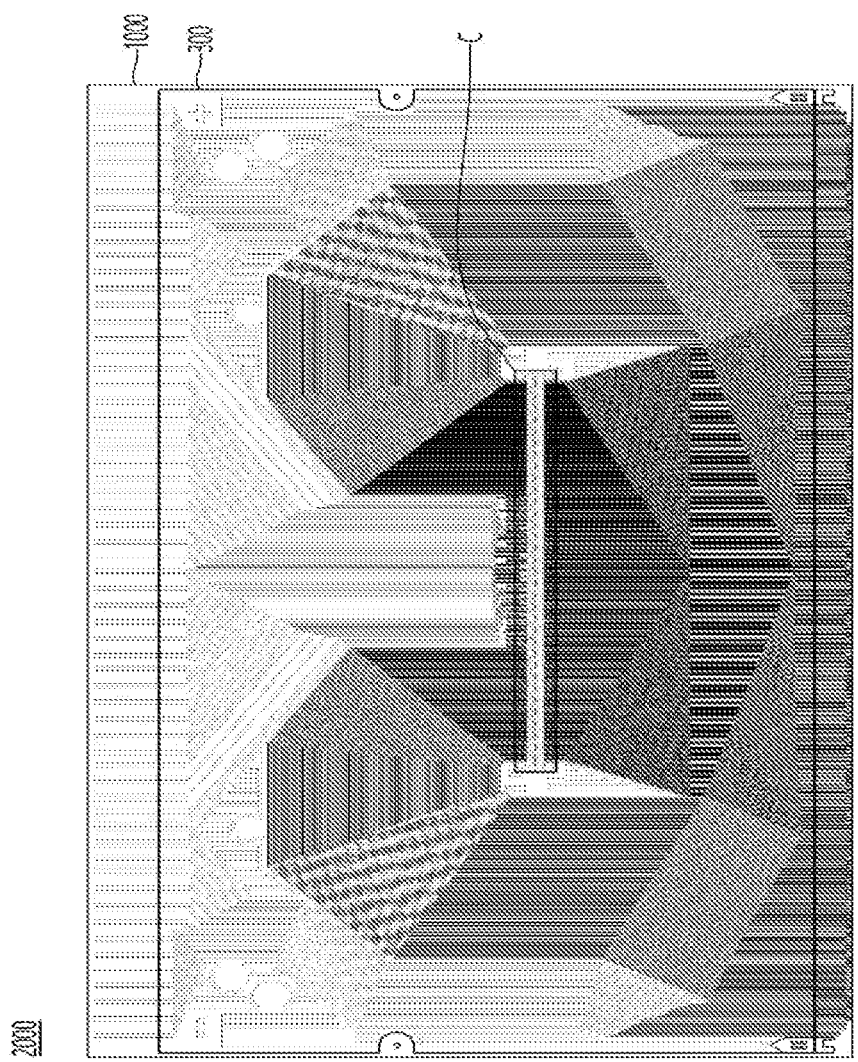
FIG. 12 is a top view of a COF module according to an embodiment.

FIG. 12 is a view showing a top view of a COF module according to an embodiment.

Referring to FIG. 12, the COF module according to the embodiment may include the flexible printed circuit board described above and the chip C disposed in the chip mounting region CA of the flexible printed circuit board 1000.

In addition, the flexible printed circuit board 1000 may include the protective layer 300 described above.

Meanwhile, the COF module may be manufactured by cutting the second region 2A of the flexible printed circuit board 1000 and then mounting the chip C. In detail, after cutting the boundary line CL between the first region 1A and the second region 2A of FIG. 1, a COF module 2000 may be manufactured, in which a driving chip electrically connected to the first circuit pattern, the second circuit pattern, and the third circuit pattern and disposed in the chip mounting region of the flexible printed circuit board is mounted.

The COF module may be positioned between the display panel and the substrate to connect an electrical signal.

That is, pad portions of the first circuit pattern and the second circuit pattern that are exposed without the protective layer 300 being disposed may be connected to the display panel and the printed circuit board, and the third circuit pattern in the chip mounting region may be connected to the chip.

Figure 13:
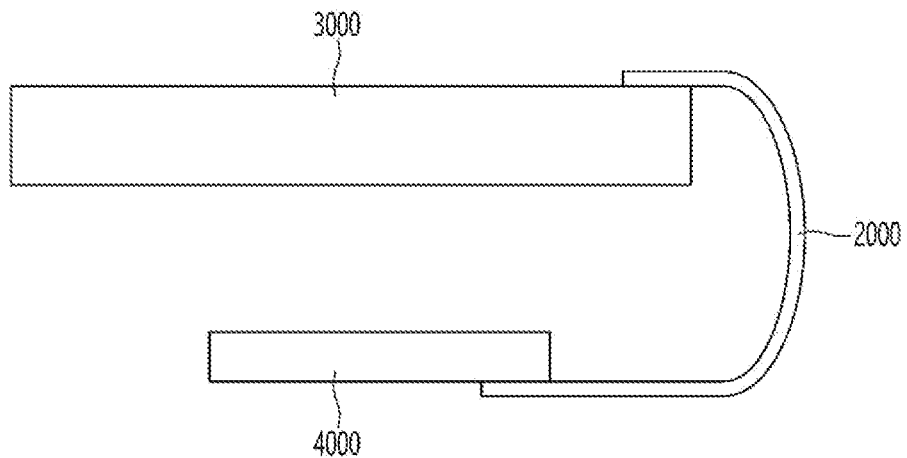
FIG. 13 is a cross-sectional view showing a connection relationship of the COF module including the flexible printed circuit board according to the embodiment.

Referring to FIG. 13, one end of the COF module 2000 including the flexible printed circuit board according to the embodiment may be connected to a display panel 3000, and the other end opposite to the one end may be connected to a printed circuit board 4000.

For example, one end of the COF module 2000 including the flexible printed circuit board according to the embodiment may be electrically connected by being in contact with the display panel 3000, and the other end opposite to the one end may be electrically connected by being in contact with the printed circuit board 4000. Here, the contact may refer to a direct contact. Alternatively, it may refer to contacting with an anisotropic conductive film (ACF) interposed therebetween.

As an example, the ACF may be disposed between the COF module 2000 and the printed circuit board 4000. The COF module 2000 and the printed circuit board 4000 may be electrically connected while being bonded by the ACF. The ACF may be a resin in which conductive particles are dispersed. Therefore, the electrical signal connected by the printed circuit board 4000 may be transmitted to the COF module 2000 through the conductive particles included in the ACF.

Since the COF module 2000 includes a flexible substrate, it may have a rigid shape or a bent shape between the display panel 3000 and the printed circuit board 4000.

The COF module 2000 may connect between the display panel 3000 and the printed circuit board 4000 disposed opposite to each other in a bent shape, thereby reducing a thickness of the electronic device and improving the degree of freedom in design. In addition, since the COF module 2000 including the flexible substrate may not be disconnected even in the bent shape, the reliability of the electronic device including the COF module may be improved.

Since the COF module is flexible, it may be used in various electronic devices.

Figure 14:
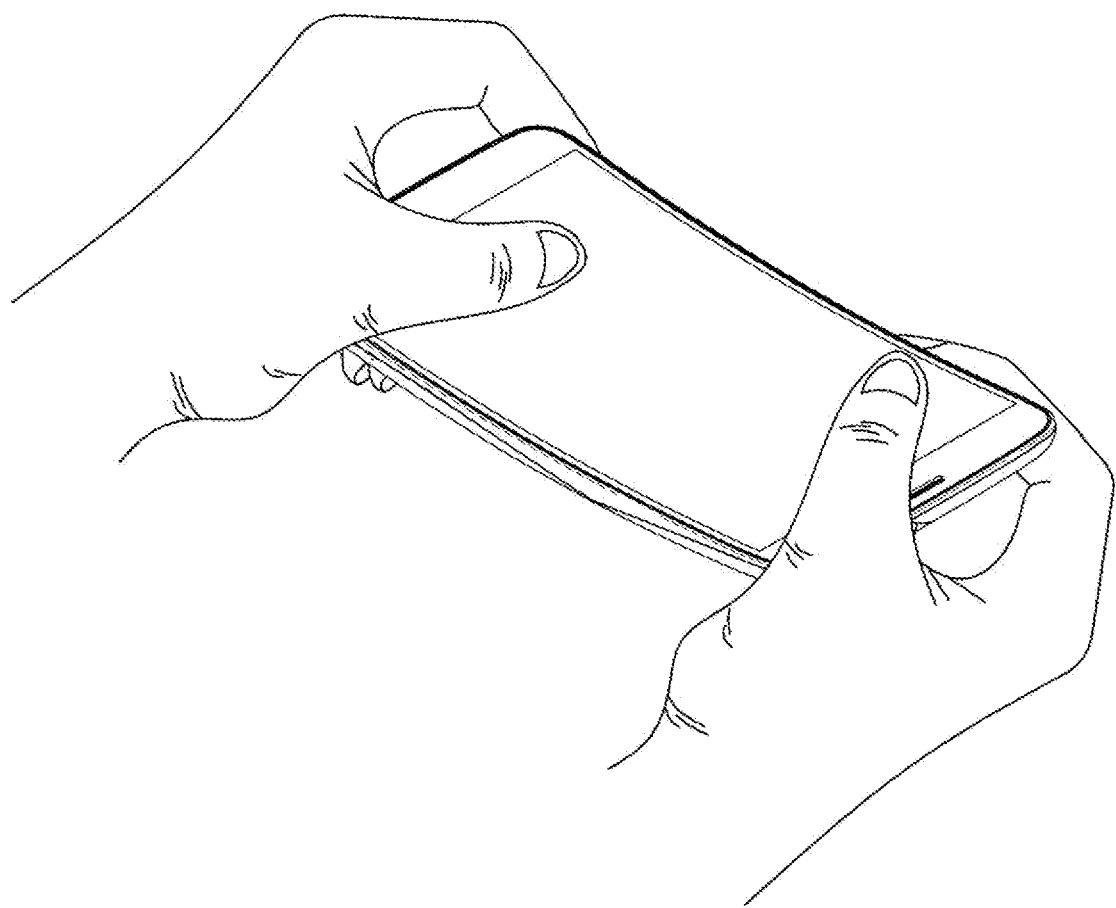
FIGS. 14 to 16 are views of an electronic device including the flexible printed circuit board according to the embodiment.

For example, referring to FIG. 14, the COF module may be included in a bendable flexible touch window. Therefore, a touch device including the same may be a flexible touch device. Therefore, a user may bend or fold it by hand. Such a flexible touch window may be applied to a wearable touch or the like.

Figure 15:
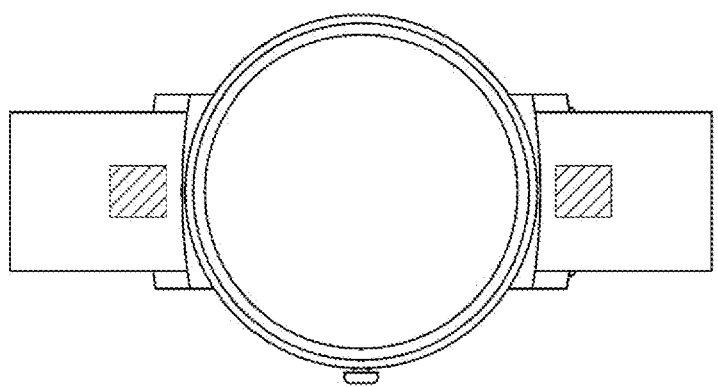

Referring to FIG. 15, the COF module may be included in various wearable touch devices including a curved display. Therefore, an electronic device including the COF module may be reduced in thickness or weight.

Figure 16:
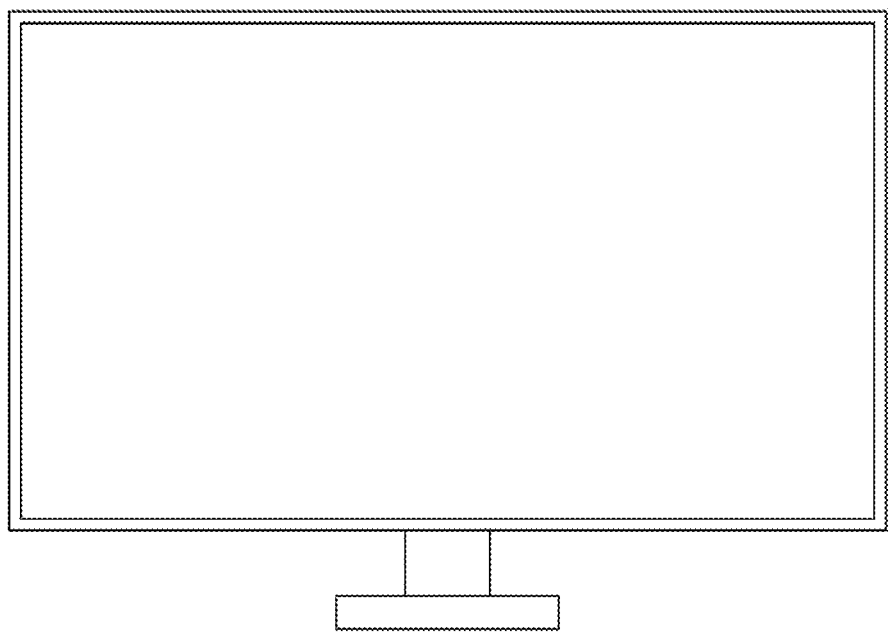

Referring to FIG. 16, the COF module may be used for various electronic devices having a display portion such as a TV, a monitor, and a laptop computer. In this case, the COF module may be used for an electronic device having a curved-shaped display portion However, the embodiment is not limited thereto, and of course, such a COF flexible printed circuit board and a COF module obtained by processing the same may be used for various electronic devices.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present disclosure.

In addition, embodiments are mostly described above, but the embodiments are merely examples and do not limit the present disclosure, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present disclosure defined in the following claims.

What is claimed is:

1. A flexible printed circuit board comprising:
   a substrate;
   a buffer layer on the substrate;
   a circuit pattern disposed on the buffer layer,
   wherein the substrate includes a chip mounting region, and
   the circuit pattern includes a wiring portion and a pad portion,
   wherein the circuit pattern includes:
   a first circuit pattern including a first-first pad portion disposed inside the chip mounting region of the substrate, a first-second pad portion disposed outside the chip mounting region of the substrate, and a first wiring portion that connects the first-first pad portion and the first-second pad portion, and the first wiring portion extending in a first direction;
   a second circuit pattern including a second-first pad portion disposed inside the chip mounting region of the substrate, a second-second pad portion disposed outside the chip mounting region of the substrate, and a second wiring portion that connects the second-first pad portion and the second-second pad portion, and the second wiring portion extending in a second direction; and
   a third circuit pattern including:
   a plurality of third pad portions disposed inside the chip mounting region of the substrate, and the plurality of third pad portions are in contact with the buffer layer inside the chip mounting region,
   a third wiring portion connecting the plurality of third pad portions inside the chip mounting region of the substrate, and the third wiring portion is in contact with the buffer layer inside the chip mounting region, and
   an extension wiring portion that extends to the outside of the third pad portions, and
   a protective layer is disposed on the first wiring portion and the second wiring portion.

2. The flexible printed circuit board of claim 1, wherein the first circuit pattern is connected to a chip disposed in the chip mounting region through the first-first pad portion and connected to a printed circuit board through the first-second pad portion,
   the second circuit pattern is connected to the chip through the second-first pad portion and connected to a display panel through the second-second pad portion, and
   the chip is connected to the plurality of third pad portions disposed inside the chip mounting region of the substrate.

3. The flexible printed circuit board of claim 1, wherein a plurality of third circuit patterns are disposed in the chip mounting region of the substrate.

4. The flexible printed circuit board of claim 1, wherein the third wiring portion includes a third-first wiring portion and a third-second wiring portion that extend in different directions, and
   the third-first wiring portion and the third-second wiring portion are connected to each other.

5. The flexible printed circuit board of claim 4, wherein the third-second wiring portion extends in the first direction or the second direction, and
   the third-first wiring portion extends in third and fourth directions perpendicular to the first direction or the second direction.

6. The flexible printed circuit board of claim 4, wherein the plurality of third pad portions includes a third-first pad portion and a third-second pad portion connected to the third-first wiring portion.

7. The flexible printed circuit board of claim 6, wherein the extension wiring portion includes a first extension wiring portion extending from the third-first pad portion and a second extension wiring portion extending from the third-second pad portion.

8. The flexible printed circuit board of claim 7, wherein one side of the first extension wiring portion is connected to the third-first pad portion, and the other side of the first extension wiring portion is surrounded by the protective layer.

9. The flexible printed circuit board of claim 6, wherein the plurality of third pad portions includes a third-third pad portion connected to the third-second wiring portion.

10. The flexible printed circuit board of claim 9, wherein the plurality of third pad portions includes a third-fourth pad portion disposed in an intersection region of the third-first wiring portion and the third-second wiring portion.

11. The flexible printed circuit board of claim 10, wherein the plurality of third pad portions includes at least one of a third-fifth pad portion between the third-first pad portion and the third-fourth pad portion and a third-sixth pad portion between the third-second pad portion and the third-fourth pad portion.

12. The flexible printed circuit board of claim 11, wherein the third wiring portion includes a bent portion, and
at least one of the third-first pad portion, the third-second pad portion, the third-third pad portion, the third-fourth pad portion, the third-fifth pad portion, and the third-sixth pad portion is disposed on the bent portion of the third wiring portion.

13. The flexible printed circuit board of claim 4, wherein the third-second wiring portion is formed integrally with the second wiring portion.

14. The flexible printed circuit board of claim 4, wherein the third-first wiring portion includes a first-first region adjacent to the third-first pad portion and a first-second region between the third-first pad portion and the third-second pad portion, and
a width of the first-second region is greater than a width of the first-first region.

15. The flexible printed circuit board of claim 1, further comprising
a fourth circuit pattern connected to the chip in the chip mounting region of the substrate and including at least one fourth wiring portion.

16. The flexible printed circuit board of claim 15, wherein the fourth circuit pattern includes a fourth pad portion disposed inside the chip mounting region of the substrate, and
the fourth wiring portion extends to the outside of the fourth pad portion.

17. The flexible printed circuit board of claim 16, wherein the protective layer is disposed on the fourth wiring portion, and
one side of the fourth wiring portion is connected to the fourth pad portion, and the other side of the fourth wiring portion is surrounded by the protective layer.

18. The flexible printed circuit board of claim 1, wherein the third wiring portion includes a bent portion.

19. A chip on film (COE) module comprising:
the flexible printed circuit board according to claim 1; and
a chip disposed in the chip mounting region of the substrate.

20. An electronic device comprising:
the COF module according to claim 19;
a display panel connected to the first circuit pattern; and
a printed circuit board connected to the second circuit pattern.

* * * * *